United States Patent
Cheng et al.

(10) Patent No.: US 12,494,392 B2
(45) Date of Patent: Dec. 9, 2025

(54) GRAPHITE DISC

(71) Applicant: ENKRIS SEMICONDUCTOR, INC., Suzhou (CN)

(72) Inventors: Kai Cheng, Suzhou (CN); Liyang Zhang, Suzhou (CN)

(73) Assignee: ENKRIS SEMICONDUCTOR, INC., Suzhou (CN)

( * ) Notice: Subject to any disclaimer, the term of this patent is extended or adjusted under 35 U.S.C. 154(b) by 457 days.

(21) Appl. No.: 18/301,502

(22) Filed: Apr. 17, 2023

(65) Prior Publication Data

US 2023/0253225 A1    Aug. 10, 2023

Related U.S. Application Data

(63) Continuation of application No. PCT/CN2020/128390, filed on Nov. 12, 2020.

(51) Int. Cl.
    *H01L 21/673*    (2006.01)
    *C23C 16/458*    (2006.01)
    *C30B 25/12*     (2006.01)

(52) U.S. Cl.
    CPC .... *H01L 21/67316* (2013.01); *C23C 16/4584* (2013.01); *C30B 25/12* (2013.01)

(58) Field of Classification Search
    CPC ... C23C 16/4584; C30B 25/12; H01L 21/673; H01L 21/67316
    See application file for complete search history.

(56) References Cited

U.S. PATENT DOCUMENTS

2011/0259270 A1* 10/2011 Minoura ............. C04B 41/87
                                                    118/728
2016/0083840 A1    3/2016 Rao et al.
(Continued)

FOREIGN PATENT DOCUMENTS

| CN | 103173744 A | 6/2013 |
| CN | 103898478 A | 7/2014 |

(Continued)

OTHER PUBLICATIONS

International Search Report issued in corresponding PCT Application No. PCT/CN2020/128390, dated Jul. 26, 2021.
(Continued)

*Primary Examiner* — Jaehwan Oh
(74) *Attorney, Agent, or Firm* — Westbridge IP LLC

(57) ABSTRACT

Disclosed is a graphite disc solving a problem of poor performance uniformity of the epitaxial wafer, which is obtained during material epitaxial growth by using the graphite disc. The graphite disc includes a graphite disc body, where the graphite disc body includes a groove and a plurality of projections on a bottom wall of the groove, and the plurality of projections divide the groove into a plurality of independent regions. According to the graphite disc provided by the present disclosure, a plurality of regions are defined in the groove by using the projections, each region corresponds to one substrate, and different regions are interconnected. Compared with the graphite disc structure with one groove corresponding to one substrate in the related art, a space for gas flow is enlarged, therefore a problem that an edge of the epitaxial wafer is too thick caused by gas flow is alleviated.

13 Claims, 4 Drawing Sheets

(56) References Cited

U.S. PATENT DOCUMENTS

| | | | | |
|---|---|---|---|---|
| 2023/0098865 A1* | 3/2023 | Cheng | ............... | H01J 37/32715 |
| | | | | 118/725 |
| 2023/0105081 A1* | 4/2023 | Cheng | .................... | C30B 25/12 |
| | | | | 118/725 |

FOREIGN PATENT DOCUMENTS

| CN | 209243171 U | 8/2019 |
|---|---|---|
| CN | 111088483 A | 5/2020 |
| CN | 211112316 U | 7/2020 |
| CN | 111599746 A | 8/2020 |
| CN | 211848131 U | 11/2020 |

OTHER PUBLICATIONS

Written Opinion issued in corresponding PCT Application No. PCT/CN2020/128390, dated Jul. 26, 2021.

* cited by examiner

GRAPHITE DISC

CROSS-REFERENCE TO RELATED APPLICATIONS

This application is a continuation of International Application No. PCT/CN2020/128390, filed on Nov. 12, 2020, which is hereby incorporated by reference in its entirety.

TECHNICAL FIELD

The present disclosure relates to the field of semiconductor material growing device technologies, and in particular, to a graphite disc.

BACKGROUND

Light emitting diode (LED) is a solid-state semiconductor diode light emitting device, which is widely used in the lighting fields such as indicator lamps and display screens. At present, a method for manufacturing LED wafers is mainly achieved by metal-organic chemical vapor deposition (MOCVD), and the process may be described as follows: putting a substrate in a groove of a graphite disc, putting the graphite disc loaded with the substrate into a reaction chamber of MOCVD, heating the reaction chamber to a preset temperature, and cooperatively injecting metal-organic compounds and V-group gases so that chemical bonds of the metal-organic compounds and V-group gases may be broken and re-polymerized to form an LED epitaxial layer on the substrate.

However, performance uniformity of the epitaxial wafer obtained according to the above process is poor, for example, a wavelength of the LED is uneven, a surrounding edge is thick, and so on.

SUMMARY

In view of this, the present disclosure provides a graphite disc, to solve the problem of poor performance uniformity of the epitaxial wafer, which is obtained, by using the graphite disc, through the material epitaxial growth in the prior art.

The present disclosure provides a graphite disc, including a graphite disc body, where the graphite disc body includes a groove and a plurality of projections on a bottom wall of the groove, and the plurality of projections divide the groove into a plurality of regions independent from each other. According to the graphite disc provided by the present disclosure, a plurality of regions are defined in the groove by using the projections, each region corresponds to a substrate, and different regions are interconnected. Compared with a graphite disc structure with one groove corresponding to one substrate in the related art, a space for gas flow is enlarged, therefore a problem that an edge of the epitaxial wafer is too thick caused by gas flow is alleviated.

In a possible implementation, an edge of an orthographic projection of the groove on the graphite disc body includes at least one arc segment, and a side wall corresponding to each arc segment and at least one projection enclose a region among the plurality of regions. In this implementation, on the one hand, a surface of a side wall of the groove corresponding to the arc segment is smooth, so that an impact on the gas flow is relatively small during rotation of the graphite disc; on the other hand, a matching degree between the region and a wafer structure of a substrate may be improved to ensure that the substrate is fixed more firmly.

In a possible implementation, the at least one arc segment is a minor arc. In this implementation, two extreme points of the arc segment may be used to limit the substrate placed in the region, and accordingly, the number of projections may be reduced to increase space of a hollow region between the projections, that is, increase the space of gas flow, therefore, the problem that an edge of the epitaxial wafer is too thick caused by gas flow is alleviated.

In a possible implementation, the edge of the orthographic projection of the groove on the graphite disc body includes a plurality of arc segments and a straight-line segment between adjacent two arc segments. In this implementation, based on the principle of the shortest line between two points, an etching path in the preparation process of the groove may be shorten by connecting two arc segments with a straight-line segment, which further simplifies the preparation process.

In a possible implementation, the straight-line segment is tangent to adjacent arc segments.

In a possible implementation, the edge of the orthographic projection of the groove on the graphite disc body includes a plurality of arc segments and a polygonal-line segment between two adjacent arc segments. In this implementation, a length of the side wall of the groove may be extended by arranging a polygonal-line between two adjacent arc segments S. Since heat is transferred through the graphite disc body during an epitaxial growth process, when the side wall of the groove is extended, a heat dissipation area may be increased to avoid heat concentration, thus improving heating uniformity of the substrate, so as to ensure uniformity of an epitaxial wafer to be grown subsequently.

In a possible implementation, the side wall corresponding to each arc segment and multiple projections enclose a region among the plurality of regions, and the multiple projections surrounding the region are separated from each other. In this implementation, a gap between the adjacent projections may be used to form a gas flow channel, thus further reducing probability of unsteady gas flow, and alleviating the problem that an edge of the epitaxial wafer is too thick.

In a possible implementation, a distance between adjacent two of the multiple projections surrounding the region is greater than or equal to 1 mm.

In a possible implementation, the plurality of regions comprise a first region and a second region, the plurality of projections comprise a common projection, and the common projection is a part of both a side wall of the first region and a side wall of the second region. In this implementation, an utilization rate of the projections may be improved by arranging the common projection, thus simplifying the process.

In a possible implementation, each of the plurality of the projections is board-shaped or column-shaped.

In a possible implementation, each of the plurality of the projections includes a through-hole running through the projection in a direction parallel to the bottom wall of the groove. In this implementation, the gas flow channel may be increased by setting the through-hole in the projection, thus further reducing the probability of unsteady gas flow, and alleviating the problem that an edge of the epitaxial wafer is too thick.

In a possible implementation, the material of the plurality of projections is any one of SiC, quartz, graphite and sapphire.

In a possible implementation, a surface of each of the plurality of regions is convex or concave. In this implementation, arrangement of the surface of regions is used to adapt to a bottom surface of a substrate to be epitaxed, thus extending an application range of the graphite disc to the substrate.

According to the graphite disc provided by the embodiment of the present disclosure, a plurality of regions are defined in the groove by using the projections, each region corresponds to a substrate, and different regions are interconnected. Compared with the graphite disc structure with one groove corresponding to one substrate in the related art, a space for gas flow is enlarged, therefore a problem that an edge of the epitaxial wafer is too thick caused by gas flow is alleviated.

DETAILED DESCRIPTIONS OF THE EMBODIMENTS

As described in the background, in the related art, performance uniformity of an epitaxial wafer obtained through the material epitaxial growth by using the graphite disc is poor. A researcher found that the reasons for the poor performance uniformity of the epitaxial wafer at least include: when the graphite disc rotates at a high speed, a growth thickness of an edge of a substrate far from a center of the graphite disc is thicker due to an impact of gas flow.

As described above, the present disclosure provides a graphite disc, on which a plurality of regions corresponding to substrates are interconnected, thus increasing space of gas flow and alleviating the problem that an edge of the epitaxial wafer is too thick caused by gas flow.

A clear and complete description of technical solutions in embodiments of the present disclosure is given below, in combination with accompanying drawings of the embodiments of the present disclosure. Apparently, the described embodiments are only a part, but not all of the embodiments of the present disclosure. All of the other embodiments that may be obtained by those skilled in the art based on the embodiments in the present disclosure without any inventive efforts fall into the scope protected by the present disclosure.

Figure 1:
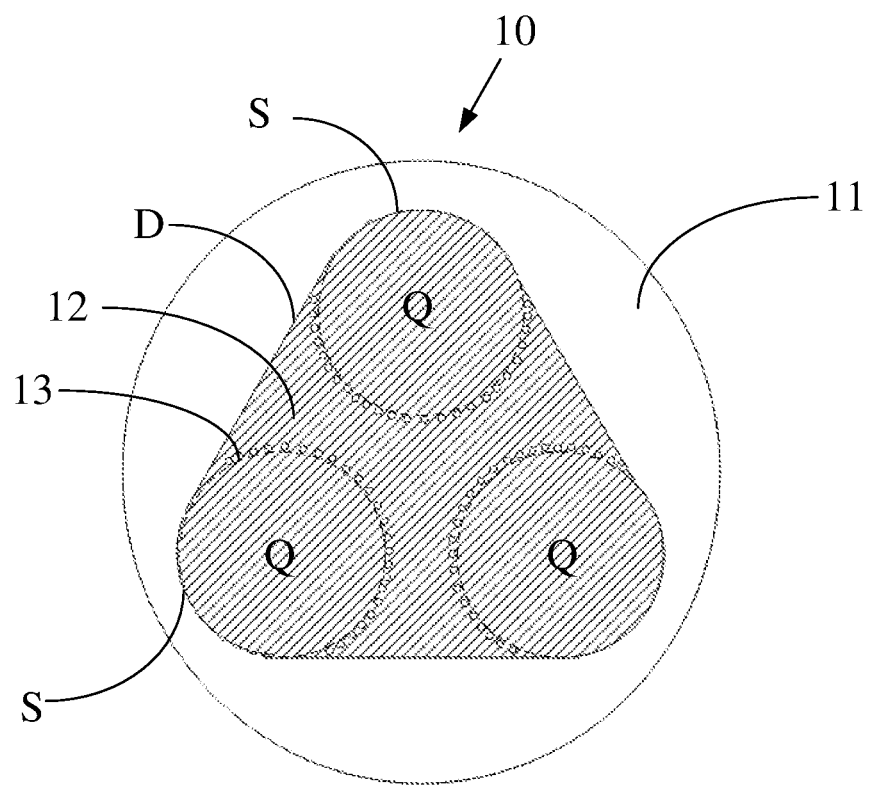
FIG. 1 is a schematic structural diagram of a graphite disc provided by an embodiment of the present disclosure.

FIG. 1 is a schematic structural diagram illustrating a graphite disc provided by an embodiment of the present disclosure. As shown in FIG. 1, the graphite disc 10 includes a graphite disc body 11, and the graphite disc body 11 includes a groove 12 and a plurality of projections 13 located on a bottom wall of the groove 12, the plurality of projections 13 divide the groove 12 into a plurality of regions Q.

A bearing surface of the graphite disc body 11 is provided with a groove 12, and the bottom wall of the groove 12 is provided with a plurality of projections 13. In an embodiment, a height of the projections 13 is less than or equal to a depth of the groove 12. A material of the projections 13 is any one of SiC, quartz, graphite and sapphire. The plurality of projections 13 divide the groove 12 into the plurality of regions Q, that is, the plurality of projections 13 act as a limit structure between different regions Q. A region Q corresponds to a substrate to be epitaxed subsequently. The shape and structure of the groove 12 and the projections 13, as well as the arrangement of the plurality of projections 13, may be reasonably set according to an actual situation. In an embodiment, a bottom surface of the plurality of regions Q is convex or concave. This arrangement is to adapt the bottom surface of the plurality of regions Q to a bottom surface of the substrate to be epitaxed, thus extending an application range of the graphite disc to the substrate.

According to the graphite disc provided by the present disclosure, a plurality of regions Q are limited in the groove 12 by using the projections 13, each region Q corresponds to a substrate, and different regions Q are interconnected. Compared with the graphite disc structure with one groove corresponding to one substrate in the related art, a space for gas flow is enlarged, therefore a problem that an edge of the epitaxial wafer is too thick caused by gas flow is alleviated.

In an embodiment, an edge of an orthographic projection of the groove 12 on the graphite disc body 11 includes at least one arc segment S, and a side wall corresponding to each arc segment S and at least one projection 13 enclose a region Q among the plurality of regions, that is, each region Q is surrounded by a part of the side wall of the groove 12 and at least one projection 13. The advantages are, on the one hand, a surface of a side wall of the groove corresponding to the arc segment is smooth, so that an impact on the gas flow is relatively small during rotation of the graphite disc; on the other hand, a matching degree between the region and a wafer structure of a substrate may be improved to ensure that the substrate is fixed more firmly.

In an embodiment, as shown in FIG. 1, an edge of an orthographic projection of the groove 12 on the graphite disc body 11, further includes a straight-line segment D between adjacent two of the arc segments S. The straight-line segment D is only used as a part of the side wall of the groove 12, but is not used to limit the substrate, that is, it is not used to form a side wall of the region Q. Based on the principle of the shortest line between two points, an etching path in the preparation process of the groove 12 may be shorten by connecting two arc segments S with the straight-line segment D, which further simplifies the preparation process.

In an embodiment, as shown in FIG. 1, the straight-line segment D is tangent to the adjacent arc segments S. In this case, it may further improve smoothness of the side wall of the groove 12, so as to prevent a direction of gas flow to be affected during rotation.

In an embodiment, as shown in FIG. 1, the side wall corresponding to each arc segment S and multiple projections 13 enclose a region among the plurality of regions Q, and the multiple projections 13 surrounding the region Q are separated from each other. In an embodiment, in reference to FIG. 2, a distance D between adjacent two of the multiple projections 13 surrounding the region Q is greater than or equal to 1 mm. In this way, the gap between the adjacent projections 13 may be used to form a gas flow channel, thus further reducing the probability of unsteady gas flow, and alleviating the problem that an edge of the epitaxial wafer is too thick.

Figure 2:
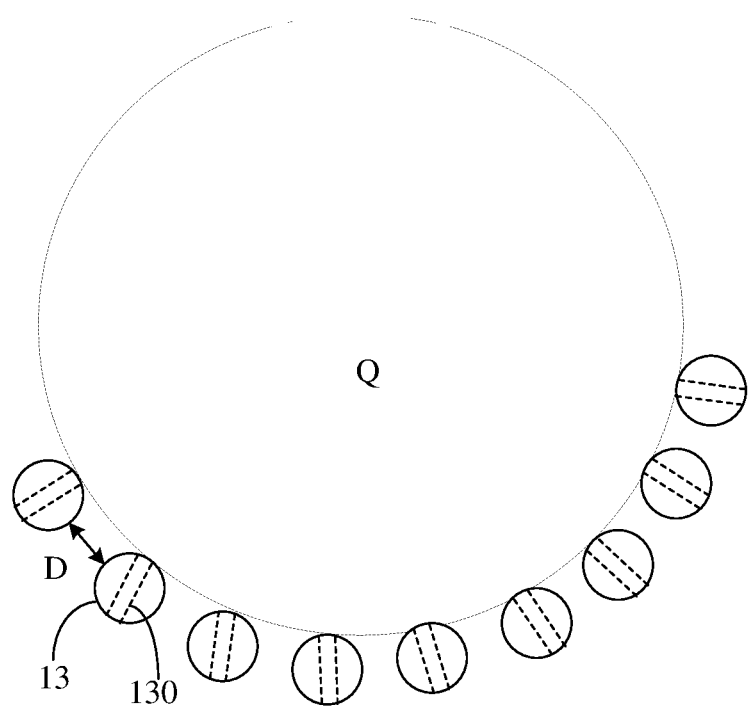
FIG. 2 is a schematic structural diagram of a region of the graphite disc provided by an embodiment of the present disclosure.
Figure 3:
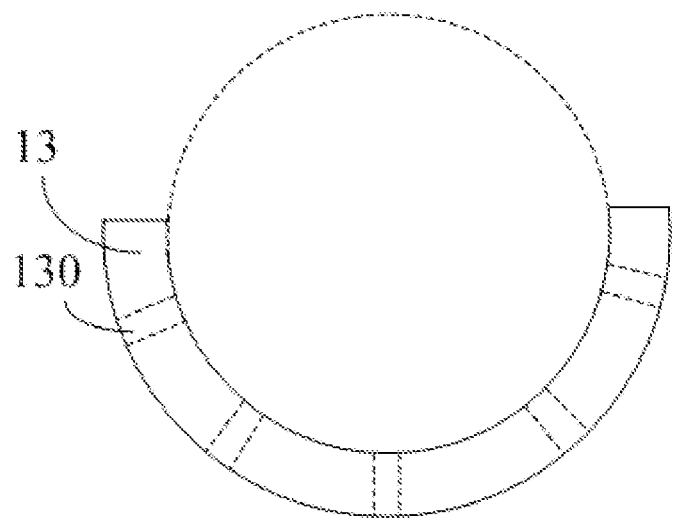
FIG. 3 is a schematic structural diagram of a region of the graphite disc provided by an embodiment of the present disclosure.
Figure 4:
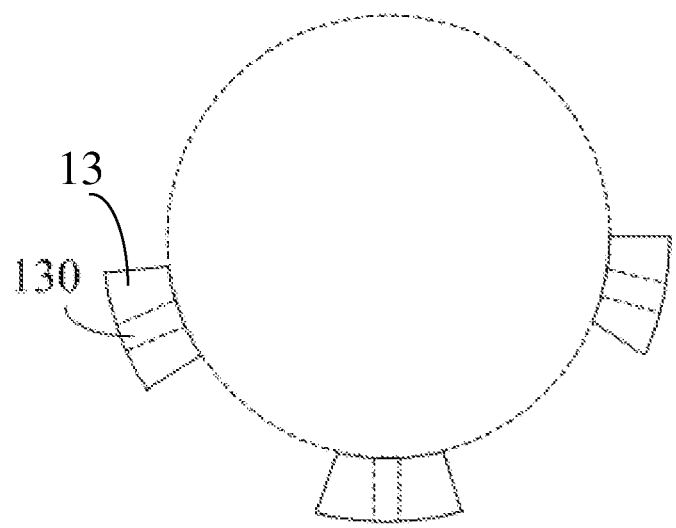
FIG. 4 is a schematic structural diagram of a region of the graphite disc provided by an embodiment of the present disclosure.

FIG. 2, FIG. 3, and FIG. 4 are schematic structural diagrams illustrating regions of the graphite disc provided by different embodiments of the present disclosure. As shown in FIG. 2, the projection 13 may be column-shaped; as shown in FIG. 3 and FIG. 4, the projection 13 may be board-shaped. The structure of the column-shaped or board-shaped projection is simple and easy to prepare. In an embodiment, as shown in FIG. 2, FIG. 3 and FIG. 4, the projection 13 includes a through-hole 130, which runs through the projection 13 in a direction parallel to the bottom wall of the groove 13. For example, as shown in FIG. 2, the projection 13 is column-shaped, multiple projections 13 and a part of the side wall of the groove 12 enclose the region Q, and each projection 13 is provided with at least one through-hole 130. For another example, as shown in FIG. 3, the projection 13 is board-shaped, and the number of the projection 13 is one, multiple projections 13 and a part of the side wall of the groove 12 enclose the region Q, and the projection 13 is provided with a plurality of through-holes 130. For another example, as shown in FIG. 4, the projections 13 are board-shaped, and the number of projections 13 is more than one, multiple projections 13 and a part of the side wall of the groove 12 enclose the region Q, and each projection 13 is provided with at least one through-hole 130. By setting a through-hole 130 in the projection 13, the gas flow channel may be increased by setting the through-hole in the projection, thus further reducing the probability of unsteady gas flow, and alleviating the problem that an edge of the epitaxial wafer is too thick.

Figure 5:
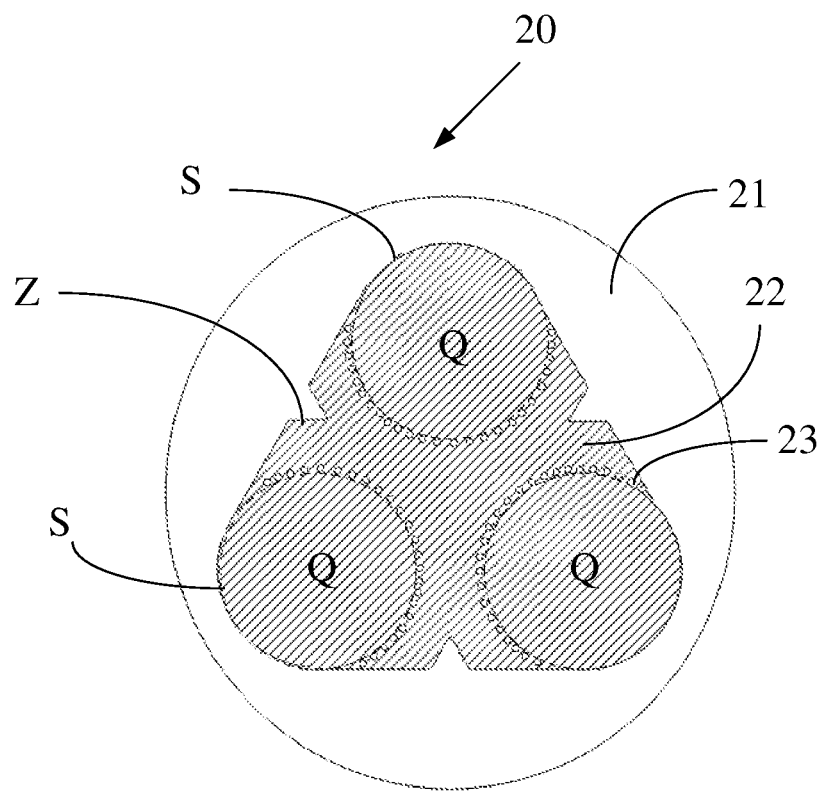
FIG. 5 is a schematic structural diagram of a graphite disc provided by an embodiment of the present disclosure.

FIG. 5 is a schematic structural diagram illustrating a graphite disc provided by the second embodiment of the present disclosure. As shown in FIG. 5, the difference between a graphite disc 20 and the graphite disc 10 shown in FIG. 1 is that the edge of an orthographic projection of the groove 22 on the graphite disc body 21 includes a plurality of arc segments S and a polygonal-line segment Z between two adjacent arc segments S. By setting a polygonal-line segment Z between the two arc segments S, a length of the side wall of the groove 22 may be extended. Since heat is transferred through the graphite disc body 21 during an epitaxial growth process, when the side wall of the groove 22 is extended, a heat dissipation area may be increased to avoid heat concentration, thus improving heating uniformity of the substrate, so as to ensure uniformity of an epitaxial wafer to be grown subsequently.

Figure 6:
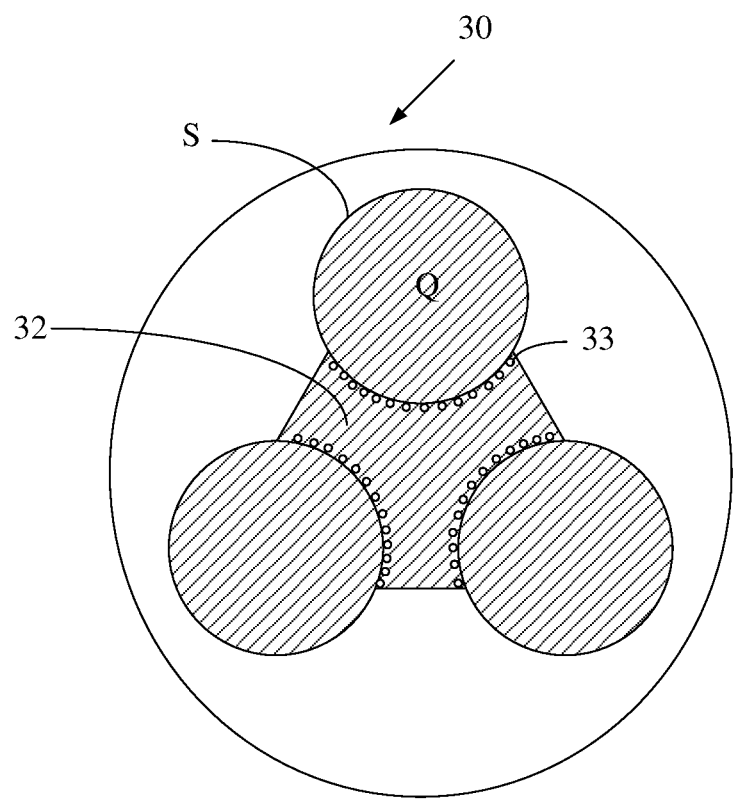
FIG. 6 is a schematic structural diagram of a graphite disc provided by an embodiment of the present disclosure.

FIG. 6 is a schematic structural diagram illustrating a graphite disc provided by an embodiment of the present disclosure. As shown in FIG. 6, the difference between the graphite disc 20 and the graphite disc 10 shown in FIG. 1 is that an orthographic projection of the arc-shaped side wall of the groove 32 n the graphite disc body 31 used to enclose a region Q is a minor arc. In this way, the two ends of the arc segment S may be used to limit the substrate placed in the region Q, and accordingly, it may reduce the number of projections 33, so as to increase the hollow region between the projections 33, that is, increase the gas flow space, and further alleviate the problem of edge thickness caused by the gas flow.

Figure 7:
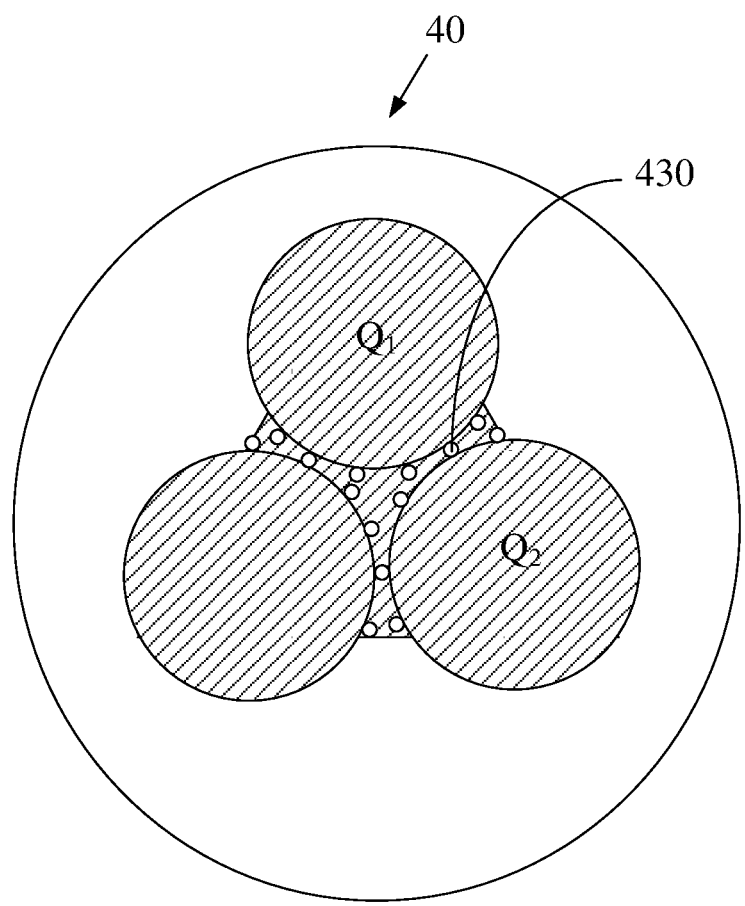
FIG. 7 is a schematic structural diagram of a graphite disc provided by an embodiment of the present disclosure.

FIG. 7 is a schematic structural diagram illustrating a graphite disc provided by an embodiment of the present disclosure. As shown in FIG. 7, in this embodiment, the graphite disc 40 includes a plurality of regions, and the plurality of regions include a first region Q1 and a second region Q2. A plurality of projections 43 include a common projection 430; the common projection 430 is a part of both a side wall of the first region Q1 and a side wall of the second region Q2. The common projection 430 refers to a projection that forms a boundary of at least two regions at the same time. The number and location of the common projection 430 may be reasonably set according to an actual demand. The utilization rate of the projections may be improved by setting the common projection 430, thus simplifying the process.

The above-mentioned embodiments are only the preferred embodiments of the present disclosure, and not intended to limit the scope protected by the present disclosure. Any modification, equivalent replacement, improvement, and so on, made in the spirit and principle of the present disclosure shall fall into the scope protected by the present disclosure.

What is claimed is:

1. A graphite disc, comprising:
  a graphite disc body, wherein the graphite disc body comprises a groove and a plurality of projections on a bottom wall of the groove, and the plurality of projections divide the groove into a plurality of regions independent from each other.

2. The graphite disc according to claim 1, wherein an edge of an orthographic projection of the groove on the graphite disc body comprises at least one arc segment, and a side wall corresponding to each of the at least one arc segment and at least one of the plurality of projections enclose a region among the plurality of regions.

3. The graphite disc according to claim 2, wherein the at least one arc segment is a minor arc.

4. The graphite disc according to claim 2, wherein the edge of the orthographic projection of the groove on the graphite disc body comprises a plurality of arc segments and a straight-line segment between adjacent two arc segments.

5. The graphite disc according to claim 4, wherein the straight-line segment is tangent to adjacent arc segments.

6. The graphite disc according to claim 2, wherein the edge of the orthographic projection of the groove on the graphite disc body comprises a plurality of arc segments and a polygonal-line segment between adjacent two arc segments.

7. The graphite disc according to claim 2, wherein the side wall corresponding to each of the at least one arc segment and multiple projections enclose the region among the plurality of regions, and the multiple projections are separated from each other.

8. The graphite disc according to claim 7, wherein a distance between adjacent two of the multiple projections is greater than or equal to 1 mm.

9. The graphite disc according to claim 2, wherein the plurality of regions comprise a first region and a second region, the plurality of projections comprise a common projection, and the common projection is a part of both a side wall of the first region and a side wall of the second region.

10. The graphite disc according to claim 1, wherein each of the plurality of projections is board-shaped or column-shaped.

11. The graphite disc according to claim 1, wherein each of the plurality of projections comprises a through-hole running through the projection in a direction parallel to the bottom wall of the groove.

12. The graphite disc according to claim 1, wherein a material of the plurality of projections is any one of SiC, quartz, graphite and sapphire.

13. The graphite disc according to claim 1, wherein a surface of each of the plurality of regions is convex or concave.

* * * * *